US008120380B2

(12) United States Patent
Heiman et al.

(10) Patent No.: US 8,120,380 B2
(45) Date of Patent: Feb. 21, 2012

(54) COMPREHENSIVE APPLICATION POWER TESTER

(75) Inventors: Errol C. Heiman, Boulder, CO (US); Henry E. Davenport, Longmont, CO (US); Jack W. Lakey, Boulder, CO (US)

(73) Assignee: Seagate Technology LLC, Cupertino, CA (US)

( * ) Notice: Subject to any disclaimer, the term of this patent is extended or adjusted under 35 U.S.C. 154(b) by 987 days.

(21) Appl. No.: 09/823,079

(22) Filed: Mar. 30, 2001

(65) Prior Publication Data

US 2002/0005730 A1 Jan. 17, 2002

Related U.S. Application Data

(60) Provisional application No. 60/193,213, filed on Mar. 30, 2000.

(51) Int. Cl.
*G06F 1/00* (2006.01)

(52) U.S. Cl. .................................. 324/764.01

(58) Field of Classification Search .................. 324/763, 324/765, 158.1; 714/733, 734, 745; 710/8, 710/10; 219/627; 363/142; 365/201; 361/33; 360/69; 318/434
See application file for complete search history.

(56) References Cited

U.S. PATENT DOCUMENTS

| | | | |
|---|---|---|---|
| 3,764,995 A | 10/1973 | Helf, Jr. et al. | |
| 3,979,672 A * | 9/1976 | Arnoldi | 324/158 T |
| 4,004,230 A | 1/1977 | Campbell | |
| 4,328,570 A * | 5/1982 | Nakagawa et al. | 368/67 |
| 4,639,916 A * | 1/1987 | Boutterin et al. | 714/27 |
| 4,764,652 A * | 8/1988 | Lee | 219/627 |
| 4,879,623 A * | 11/1989 | Baumgartner et al. | 361/33 |
| 4,899,306 A | 2/1990 | Greer | |
| 5,210,757 A | 5/1993 | Barlow et al. | |
| 5,343,083 A * | 8/1994 | Fuse | 327/404 |
| 5,353,240 A | 10/1994 | Mallory et al. | |
| 5,353,254 A * | 10/1994 | Sakamoto | 365/201 |
| 5,386,183 A * | 1/1995 | Cronvich et al. | 318/434 |
| 5,621,742 A * | 4/1997 | Yoshino | 714/745 |
| 5,668,745 A | 9/1997 | Day | |
| 5,712,553 A * | 1/1998 | Hallberg | 307/75 |
| 5,862,391 A | 1/1999 | Salas et al. | |
| 5,877,956 A * | 3/1999 | Frank et al. | 364/186 |
| 5,949,671 A * | 9/1999 | Lee et al. | 363/142 |
| 5,970,074 A * | 10/1999 | Ehiro | 714/745 |
| 6,031,386 A * | 2/2000 | Cole et al. | 324/765 |
| 6,064,721 A | 5/2000 | Mohammadian et al. | |
| 6,087,844 A | 7/2000 | Kimata | |
| 6,130,530 A | 10/2000 | McNulty | |
| 6,151,182 A * | 11/2000 | Koizumi et al. | 360/69 |
| 6,154,038 A | 11/2000 | Ito et al. | |
| 6,160,517 A | 12/2000 | Bell et al. | |
| 6,189,120 B1 | 2/2001 | Akram | |
| 6,195,772 B1 | 2/2001 | Mielke et al. | |
| 6,222,172 B1 * | 4/2001 | Fossum et al. | 250/205 |
| 6,304,839 B1 | 10/2001 | Ho et al. | 703/18 |
| 6,359,426 B1 * | 3/2002 | Sarles et al. | 323/281 |
| 6,404,219 B1 * | 6/2002 | Yamamoto | 324/765 |
| 6,807,507 B2 | 10/2004 | Kumar et al. | 702/124 |
| 2002/0050813 A1 * | 5/2002 | Yamamoto | 324/158.1 |

* cited by examiner

*Primary Examiner* — Etienne Leroux

(74) *Attorney, Agent, or Firm* — Alan G. Rego; Westman, Champlin & Kelly, P.A.

(57) ABSTRACT

An electronic device power testing method is provided in which applying a nominal voltage to an electronic component, introducing a voltage disruption to the nominal voltage, and repeating the voltage disruption for a specified number of instances is done. The present invention also can be implemented as an electronic device power tester.

17 Claims, 4 Drawing Sheets

COMPREHENSIVE APPLICATION POWER TESTER

CROSS REFERENCE TO RELATED APPLICATIONS

This application claims the benefit of U.S. Provisional Application No. 60/193,213, filed Mar. 30, 2000.

FIELD OF INVENTION

The present invention relates generally to testing electronic devices and components. More particularly, the present invention relates to testing disc drives and other devices under stress conditions.

BACKGROUND OF THE INVENTION

There is a long recognized need for reliability in the manufacture and design of electronic devices. This is not any more evident than in the disc drive industry. The computer industry has adopted standards of +5 Volts DC and +12 Volts DC as nominal voltages for powering disc storage devices. Unexpected disturbances often occur in these nominal voltages during the life time of a disc storage product. The frequency and severity of these disturbances are highly random. They vary widely based on computer power supply capability, local utility quality, climate, operating environment, and other numerous factors. Design of disc storage products must provide a certain amount of immunity to these disturbances in order for the products to survive and provide useful service throughout their useful life.

Since these disturbances are highly random and unpredictable, ability to apply precisely controlled disturbances is very useful in designing disc storage products and diagnosing failures which occur in product applications.

Preventing damage from power disturbances in electronic devices is vital to the success of a product. If damaged from a power disturbance, a highly sensitive electronic device may be impaired from working properly. Some of the problems caused by power disturbances may include hardware malfunctioning, integrated circuits being rendered ineffective, memory being rewritten or lost, software and firmware erased, or data may be lost. If an electronic device is damaged by a power disturbance, the product will probably have to be completely replaced. Thus, there clearly exists a need to test the design capabilities of an electronic device to discern if the device is capable of handling the power disruptions for which it may encounter.

The present invention provides a solution to this and other problems, and offers other advantages over the prior art.

SUMMARY OF THE INVENTION

The present invention relates to a power testing system which solves the above-mentioned problem.

In accordance with one embodiment of the invention, an electronic device power testing method is provided in which applying a nominal voltage to an electronic component, introducing a voltage disruption to the nominal voltage, and repeating the voltage disruption for a specified number of instances is done.

The present invention also can be implemented as an electronic device power tester.

These and various other features as well as advantages which characterize the present invention will be apparent upon reading of the following detailed description and review of the associated drawings.

DETAILED DESCRIPTION

The present invention provides a solution to the above identified problem. The present invention has multiple uses including testing the design of electronic devices by supplying various voltage disturbances, sequences, and interruptions to the electronic device.

Figure 1:
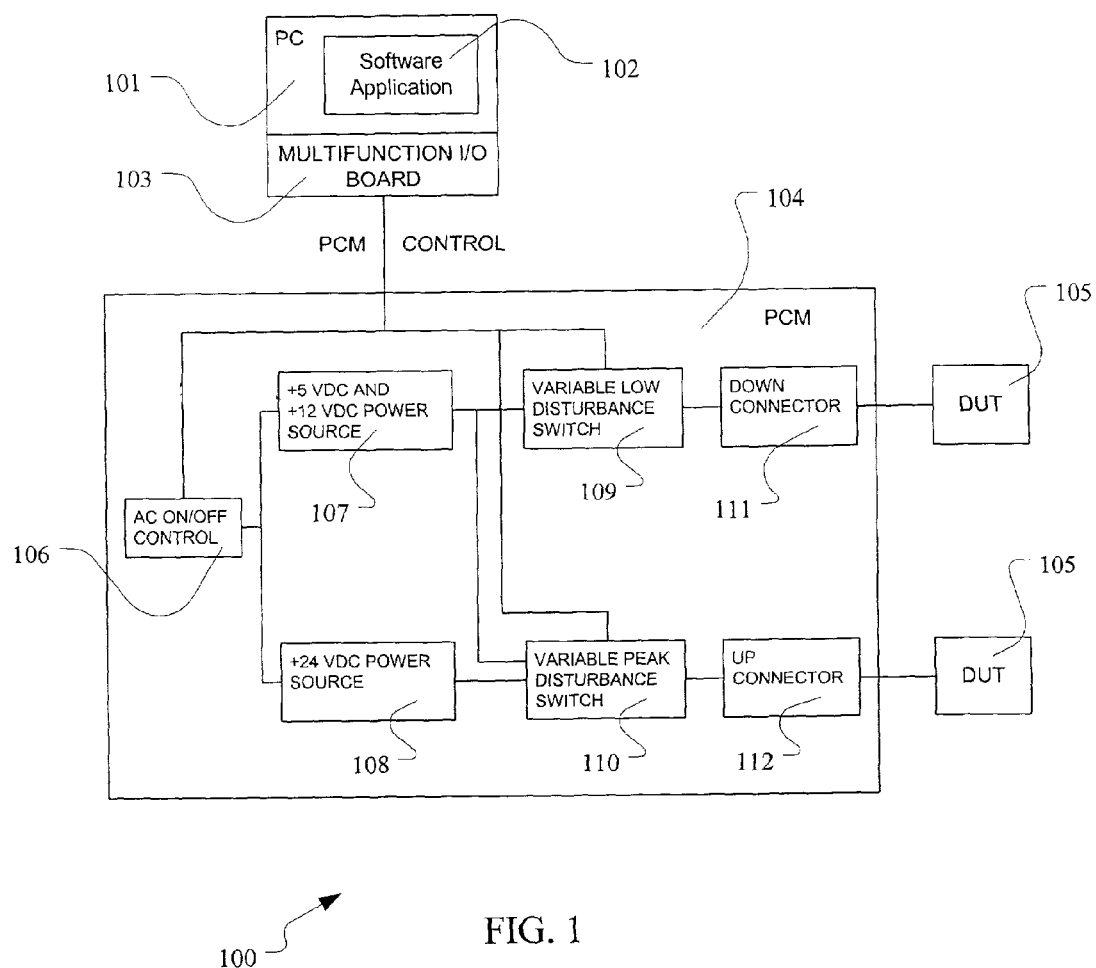
FIG. 1 is a block diagram in accordance with one preferred embodiment of the present invention.

FIG. 1 is a block diagram of a comprehensive application power tester 100 in accordance with one preferred embodiment of the present invention. A system, like the one shown in FIG. 1 includes a computer 101, computer software 102, a multifunction input/output (I/O) board 103, a power control module (PCM) 104, and at least one device under test (DUT) 105.

The software program 102 communicates with the PCM 104 through the I/O board 103. The software system provides a graphical user interface (GUI) (not shown) in which the operator can input requirements while testing. The I/O board 103 allows two-way communication between the computer 101 and the PCM 104. In one preferred embodiment, the I/O board 103 provides 3 counters/timers, 2 digital to analog (D/A) channels, 24 digital I/O lines, and 8 analog to digital (A/D) input channels.

The PCM 104 is connected to the I/O board 103 by a multiple conductor ribbon cable (not shown). In one preferred embodiment, the PCM 104 includes an AC power switch 106, a +5 Volt DC and a +12 Volt DC power source 107, a +24 Volt DC power source 108, a variable low disturbance switch 109, a variable peak disturbance switch 110, a down connector 111, and an up connector 112.

A DUT 105 is connected to the PCM 104 via a power connector (not shown). The DUT 105 can be connected to the PCM 104 at either the down connector 111 or the up connector 112. A second DUT 105 may be connected to either the up connector 112 or the down connector 111.

Figure 2:
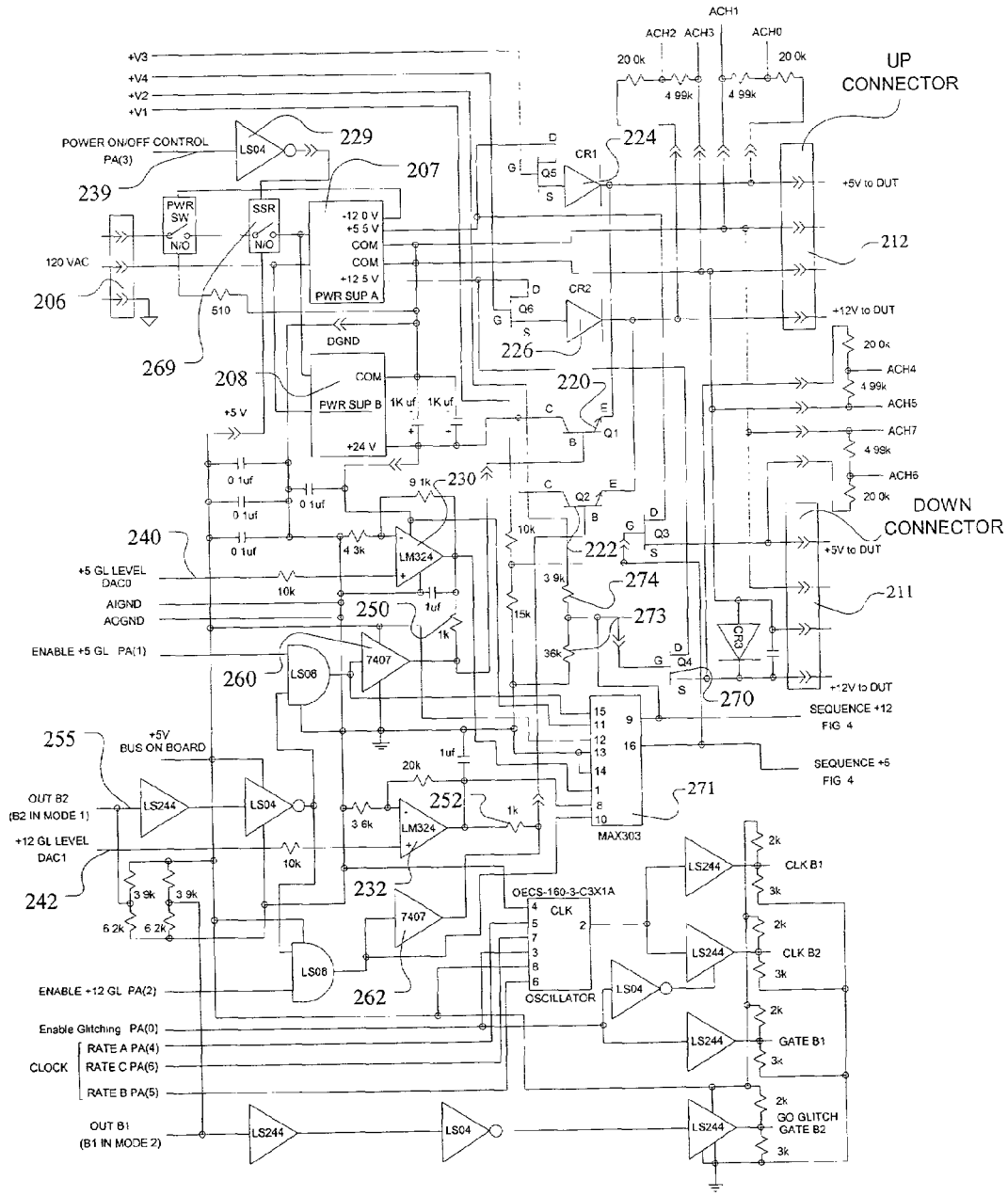
FIG. 2 is a schematic of one preferred embodiment of a power control module that can be used in the system shown in FIG. 1.

The schematic of one preferred embodiment of the PCM 104 is shown in FIG. 2. FIG. 2 illustrates a variable low disturbance switch 204 and a variable peak disturbance switch 205 as well as the other components of the PCM 104, including the 120 Volt AC power supply 206, the +5 Volt DC and +12 Volt DC power supply 207, the +24 Volt DC power supply 208, the up connector 212, and the down connector 211.

The variable peak disturbance switch 110 consists of bipolar NPN transistor 220 and transistor 222. Transistor 220 and transistor 222 are configured as emitter follower circuits to the DUT. The voltage source for transistor 220 and transistor 222 is the +24 Volt DC power supply 208. The emitter of transistor 220 is a common node with the cathode of diode 224 and the emitter of transistor 220 is a common node with the cathode of diode 226. During normal operation, power is provided to the DUT via diodes 224 and 226, respectively. During peak voltage conditions, power is provided by transistors 220 and 222 in linear conduction mode, with the voltages determined by the voltage at each of the transistor's base. The base voltages are set by operational amplifiers 230 and 232, respectively. Operational amplifiers 230 and 232 are configured as non-inverting amplifiers with positive terminal inputs set by two of the multifunction I/O board's digital-to-analog converters (DAC), 240 and 242. Transistor 220's and 222's base networks include individual, high voltage, open collector drivers 260 and 262, which are normally in a non-asserted state. Resistors 250 and 252 dissipate the individual operational amplifiers 230 and 232 voltages while high voltage, open collector drivers 260 and 262, are in a non-asserted state and transistors 220 and 222 are in a non-conduct state.

Voltage disruption frequency and voltage disruption time duration are determined by counter timers on the multifunction I/O board, specifically, 255. When line 255 asserts a voltage disruption, each of the individual high voltage drivers, 260 and 262, outputs assert to the operational amplifier's voltage, which is then reflected at the base terminals of transistors 220 and 222. This puts transistors 220 and 222 to assume a proportional conduct state and then diodes 224 and 226 serve to block the higher voltage, from transistors 220 and 222, conduction from entering the lower voltage power supplies. The result is a controlled voltage spike for a specific duration.

Figure 3:
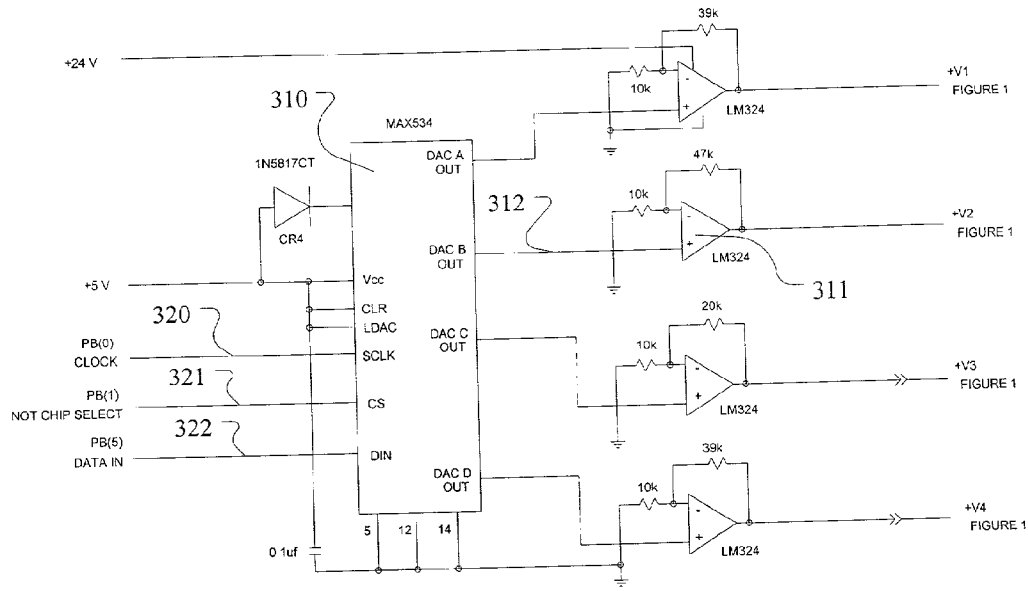
FIG. 3 is a schematic of a digital to analog converter and a multiplier which can be used with the power control module shown in FIG. 2.
Figure 4:
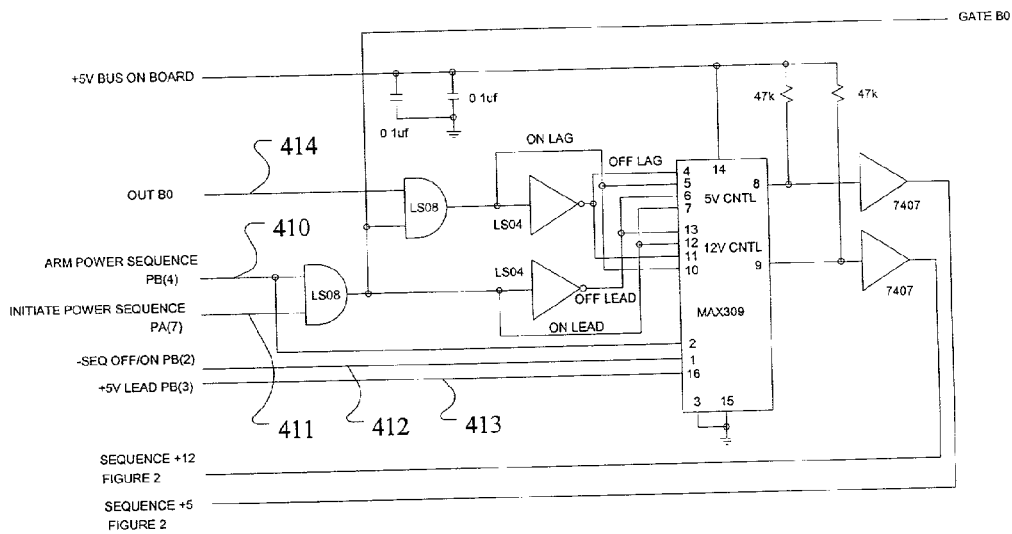
FIG. 4 is a schematic of one preferred embodiment of the power sequencing in accordance with one aspect of the present invention.

The variable low disturbance switch consists of an analog switch 271, a transistor 272, an operational amplifier 311, and a voltage divider consisting of resistors 273 and 274. In normal operation, the voltage is controlled by the output of operational amplifier 311 and the voltage divider circuit, resistors 273 and 274. The voltage provided to the voltage divider, resistors 273 and 274, is determined by a DAC output, 312, from the DAC integrated circuit 310. The voltage output from the DAC output, 312, is programmed using three digital I/O lines 320, 321, and 322. FIG. 3 shows the clock input 320 to the DAC 310. Also shown are the chip select input 321 and the data input 322. Lines 320, 321, and 322 provide the ability to program the individual DAC outputs of the DAC integrated circuit 310 with a serial data stream.

Figure 5:
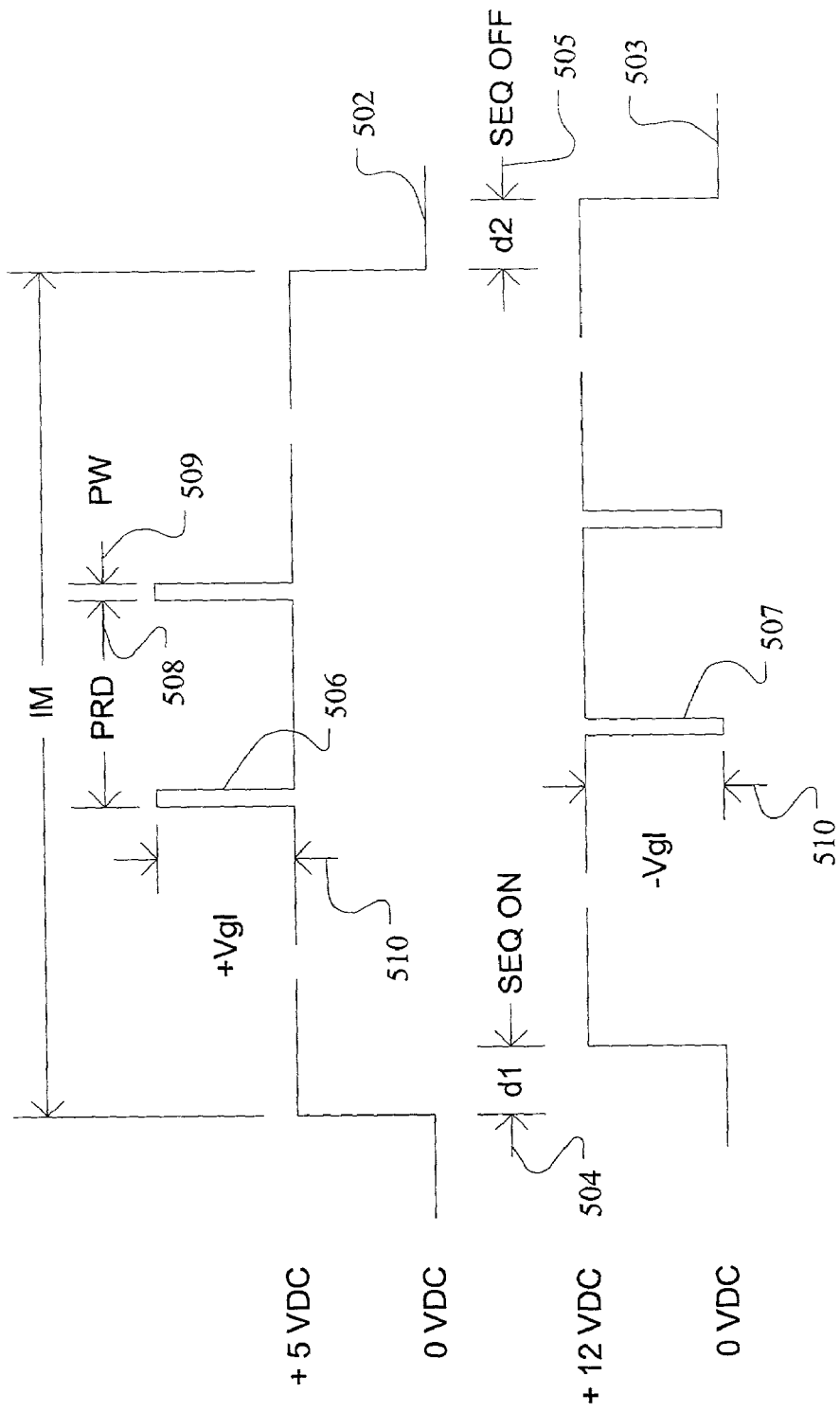
FIG. 5 illustrates timing diagrams of the power output signals in accordance with one embodiment of the present invention.

A variable low voltage disturbance occurs when the analog switch, 271, between the gate of transistor 270 and the output of operational amplifier 232 is closed(on). During that time transistor 270's gate voltage is set by the output of operational amplifier 232, which is determined by the DAC line 242 from the multifunction I/O board. The timing of the analog switch 271 to the on condition is determined by the multifunction I/O board's counter timers, specifically line 255. An example of signals that can be delivered to a DUT 105 are shown in FIG. 5.

The conventional operation of the system 100 will be described with reference to the waveforms illustrated in FIG. 5. Electronic devices are attached to the up connector 112 or the down connector 111 depending upon the type of power disruption desired. The PCM 104 power switch 106 is turned to the on position. The operator starts the software application 102 that provides control to one of the digital control lines 239 of the I/O board 103 which drives a solid state relay 269. When this control line is active and the PCM 104 power switch 106 is on, power is available for delivery to the DUT 105.

In one embodiment of the present invention, voltage sequencing is available on the down connector. In normal operation, power to the DUT attached to the down connector is not sequence controlled. However, when sequencing is required during power-on, or power off, or both; the program 102 sets the conditions for sequencing with digital control lines 410, 411, 412, and 413. By asserting 410 alone, no voltage is delivered to the DUT. When 410 is asserted and at the moment 411 is asserted, the on/off and lead/lag conditions set by 412 and 413 are performed. The time lag between lead and lag is set by the program 102 using a counter (not shown) sent out on line 414 from the multifunction I/O board 103.

With the DUT 105 powered on, the operator of the computer application 102 is able to specify voltage disruptions or glitches 506-507 to be enabled. The operator may select whether the voltage disruptions 506-507 will be enabled for the 5 Volt power 502, the 12 Volt power 503, or both. The operator is able to control the voltage disruption frequency by controlling the interval 508 between disruptions. The operator is also able to control the duration of the voltage disruption 509 and the amplitude 510. If the operator specifies a peak voltage value for the voltage disruption, then the corresponding low voltage value will be a default, and vice versa. The operator may not set both peak and low values for a given voltage. However, a peak voltage value may be set for one voltage and a low voltage value set for the other voltage.

If voltage disruptions are disabled for both voltages, then the DUT 105 receives nominal voltage with no disruptions. Nominal voltages may be set for either the up connector 112 or the down connector 111.

The preferred embodiment as described above is configured to test a hard disc drive. It should be noted that the present invention may be configured with the same or different voltage values to test a variety of electronic devices, such as floppy drives, modems, cd-roms, and dvd players. Further modifications would allow testing of any electronic component by adjusting the magnitude of the output voltage and/or adjusting the magnitude of the disturbance voltage.

It is to be understood that even though numerous characteristics and advantages of various embodiments of the present invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular elements may vary depending on the particular application for the widget while maintaining substantially the same functionality without departing from the scope and spirit of the present invention. In addition, although the preferred embodiment described herein is directed to a power testing system, it will be appreciated by those skilled in the art that the teachings of the present invention can be applied to other systems without departing from the scope and spirit of the present invention.

What is claimed is:

1. A power tester comprising:
    a multi-voltage power source having a first voltage output, which is capable of supplying a plurality of selectable voltage levels for a constant power supply voltage at a nominal power supply voltage of an electronic device;
    circuitry configured to introduce controllable disturbances into the constant power supply voltage; and an additional power source having a second voltage output, which is capable of supplying an additional voltage level that is different from the plurality of selectable voltage levels.

2. The apparatus of claim 1 wherein the disturbance is a rising pulse having a maximum voltage which is controllable.

3. The apparatus of claim 1 wherein the disturbance is a low-going pulse having a minimum voltage being less than the nominal power supply voltage.

4. The apparatus of claim 1 wherein the constant power supply voltage is selected from the group of voltages consisting of +5 VDC and +12 VDC.

5. The apparatus of claim 1 wherein the additional voltage is +24 VDC.

6. The apparatus of claim 1 including a manually operated user interface used to control the disturbance.

7. The apparatus of claim 1 wherein the disturbance is at least one pulse having a duration and a magnitude which are controllable.

8. The apparatus of claim 1 wherein the disturbance is a plurality of pulses and a frequency and a number of pulses in the plurality of pulses are controllable.

9. The apparatus of claim 1 wherein the disturbance comprises a voltage sequence applied during powering up of the electronic device.

10. A method comprising:
 supplying a plurality of selectable voltage levels for a constant power supply voltage at a nominal power supply voltage of an electronic device from a first voltage output of a multi-voltage power source;
 introducing a disturbance into the constant power supply voltage;
 controlling the disturbance; and
 supplying an additional voltage level, that is different from the plurality of selectable voltage levels, from a second voltage output of an additional power source.

11. The method of claim 10 wherein the disturbance is a rising pulse having a maximum voltage which is controllable.

12. The method of claim 10 wherein the disturbance is a low-going pulse voltage which is controllable.

13. The method of claim 10 wherein the constant power supply voltage is selected from the group of voltages consisting of +5 VDC and +12 VDC.

14. The method of claim 10 wherein the additional voltage is +24 VDC.

15. The method of claim 10 including receiving control parameters from the user interface.

16. The method of claim 10 wherein the disturbance is a pulse having a controllable duration and a controllable magnitude.

17. The method of claim 10 wherein the disturbance is a plurality of pulses and a number of the plurality of pulses are controllable.

* * * * *